United States Patent
Shimamura

(10) Patent No.: US 7,290,183 B2
(45) Date of Patent: Oct. 30, 2007

(54) METHOD OF TESTING SEMICONDUCTOR APPARATUS

(75) Inventor: Akimitsu Shimamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 267 days.

(21) Appl. No.: 10/936,533

(22) Filed: Sep. 9, 2004

(65) Prior Publication Data

US 2005/0055611 A1    Mar. 10, 2005

(30) Foreign Application Priority Data

Sep. 9, 2003   (JP)   .................. P2003-316315

(51) Int. Cl.
- G06F 17/50   (2006.01)
- G06K 5/04    (2006.01)
- G11B 5/00    (2006.01)
- G11B 20/20   (2006.01)

(52) U.S. Cl. ..................................... 714/700

(58) Field of Classification Search ................ 714/700, 714/724

See application file for complete search history.

(56) References Cited

U.S. PATENT DOCUMENTS

| | | | |
|---|---|---|---|
| 4,656,592 A | | 4/1987 | Spaanenburg et al. |
| 6,578,183 B2 * | 6/2003 | Cheong et al. | 716/7 |
| 6,708,139 B2 * | 3/2004 | Rearick et al. | 702/185 |
| 6,769,110 B2 * | 7/2004 | Katoh et al. | 716/17 |
| 7,065,683 B1 * | 6/2006 | Sluiter et al. | 714/700 |
| 2002/0129310 A1 | 9/2002 | Shin | |
| 2003/0105999 A1 | 6/2003 | Koss et al. | |
| 2005/0034091 A1 * | 2/2005 | Harn | 716/6 |

* cited by examiner

*Primary Examiner*—James C. Kerveros
(74) *Attorney, Agent, or Firm*—McDermott Will & Emery LLP

(57) ABSTRACT

A method of testing a semiconductor apparatus includes a step of dividing a region in the semiconductor apparatus into a plurality of divided regions, a step of extracting all of paths starting at registers and terminating at other registers present in the respective divided regions as candidate paths, a step of calculating delay times in signal transmissions of the candidate paths and selecting the candidate path having a maximum delay time in each divided region as a critical path, and a step of conducting a delay test for the critical path in each divided region to thereby accurately screen the semiconductor apparatus.

11 Claims, 8 Drawing Sheets

F I G. 7
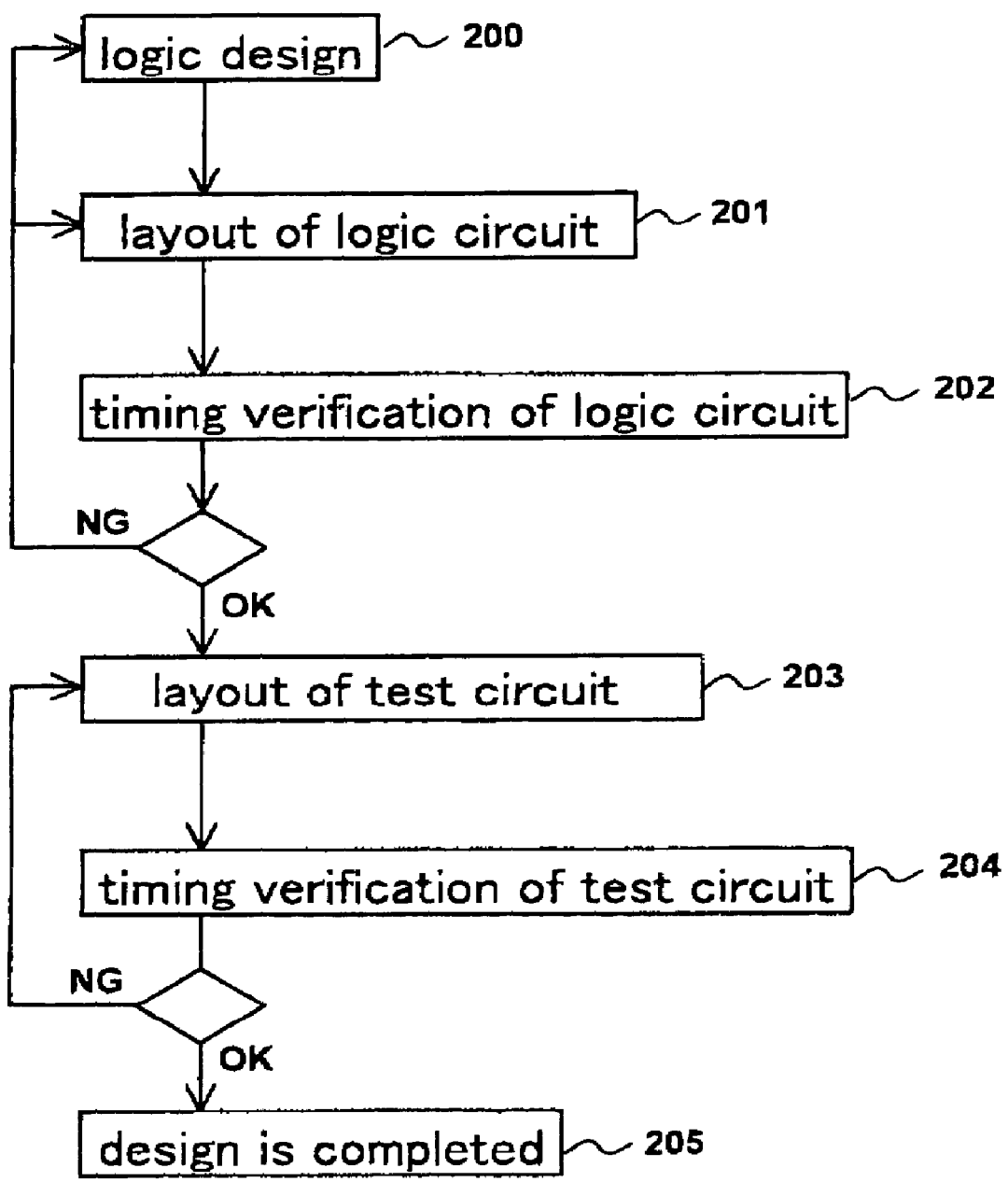

METHOD OF TESTING SEMICONDUCTOR APPARATUS

BACKGROUND OF THE INVENTION

The present invention relates to a method of testing a semiconductor apparatus.

In the method of testing the semiconductor apparatus, a signal delay in a predetermined critical path is measured in order to guarantee a speed performance. The critical path is a path, of signal paths of logic circuits, configured in such manner that an erroneous operation is generated when a signal is not transmitted within a defined time length.

As the semiconductor apparatus is more and more miniaturized, variation is generated in process parameters for each region in the same semiconductor apparatus. Further, delay time is accordingly variable. As a result, a path having an increased delay time in a signal transmission than an initially assumed critical path is generated, resulting in a failure to guarantee a predetermined operation speed.

SUMMARY OF THE INVENTION

Therefore, a main object of the present invention is to provide a method of testing a semiconductor apparatus capable of accurately screening the semiconductor apparatus through a delay test for a critical path even though a critical path of an actual chip is different to a critical path in a designing process due to process variation.

Other objects, features, and advantages of the invention will become clear by the following description.

In order to solve the mentioned problem, the method of testing the semiconductor apparatus according to the present invention is configured in the following manners.

1) A method of testing a semiconductor apparatus according to the present invention comprises:

a step of dividing a region in the semiconductor apparatus into a plurality of divided regions;

a step of extracting all of paths starting from registers and terminating at other registers present in the divided regions as candidate paths;

a step of calculating delay times in signal transmissions of the candidate paths and selecting the candidate path having a maximum delay time in each divided region as a critical path; and a step of conducting a delay test for the critical path in each divided region.

According to the test method, the critical path is set in each divided region, to which the delay test is conducted. Therefore, even in the case where a critical path of an actual chip is different to a critical path in a designing process due to process variation, the semiconductor apparatus can be accurately screened through the delay test for the critical path.

2) A method of testing a semiconductor apparatus according to the present invention comprises:

a step of dividing a region in a semiconductor apparatus into a plurality of divided regions;

a step of extracting all of wirings present in the respective divided regions;

a step of extracting paths connecting registers via the extracted wirings as candidate paths;

a step of calculating delay times in signal transmissions of the candidate paths and selecting the candidate path having a maximum delay time in each divided region as a critical path; and a test of conducting a delay test for the critical path in each divided region.

According to the test method, as far as the wirings and logic gates are present in the divided region having no register, the candidate path can be extracted, and the critical path can be selected. The delay testis then conducted for the critical path in each divided region. Therefore, even in the case where the critical path of the actual chip is different to the critical path in the designing process due to the process variation, the semiconductor apparatus can be accurately screened through the delay test for the critical path.

3) A method of testing a semiconductor apparatus according to the present invention comprises:

a step of dividing a region in the semiconductor apparatus into a plurality of divided regions;

a step of extracting all of paths starting from registers and terminating at other registers present in the divided regions as candidate paths;

a step of calculating delay times in signal transmissions of the candidate paths and selecting the candidate path having a maximum delay time in each divided region as a critical path;

a step of selecting the divided region having a maximum delay time in the signal transmission based on process information of each divided region; and a step of conducting a delay test for the critical path in each divided region.

According to the test method, the divided region having the maximum delay time in the signal transmission is previously selected using the process information, so that the delay test is conducted limited to the critical path in the selected region. Therefore, the semiconductor apparatus can be more efficiently screened than in the case where all of the divided regions are tested.

4) A method of testing a semiconductor apparatus according to the present invention comprises:

a step of dividing a region in the semiconductor apparatus into a plurality of divided regions;

a step of extracting all of wirings present in respective divided regions;

a step of extracting paths connecting registers via the extracted wirings as candidate paths;

a step of calculating delay times in signal transmissions of the candidate paths and selecting the candidate path having a maximum delay time in each divided region as a critical path;

a step of selecting the divided region having a maximum delay time in the signal transmission based on process information of each divided region; and a step of conducting a delay test for the critical path in each divided region.

According to the test method, as far as the wirings and logic gates are present in the divided region having no register, the candidate path can be extracted, and the critical path can be selected. Further, the divided region having the maximum delay time in the signal transmission is previously selected using the process information, so that the delay test is conducted limited to the critical path in the selected region. Therefore, the semiconductor apparatus can be more efficiently screened than in the case where all of the divided regions are tested.

5) A method of testing a semiconductor apparatus according to the present invention comprises:

a step of dividing a region in the semiconductor apparatus into a plurality of divided regions;

a step of judging registers present in the respective divided regions from arrangement coordinate data of the registers and extracting all of paths starting from the registers and terminating at other registers present in the divided regions as candidate paths;

a step of calculating delay times in signal transmissions of the candidate paths and selecting the candidate path having a maximum delay time in each divided region as a critical path; and a step of conducting a delay test for the critical path in each divided region, According to the test method, the arrangement coordinate data is used to thereby judge a position of the register. Therefore, it becomes easier to determine in which divided region the register belongs to when the register is present across more than one divided region 6) A method of testing a semiconductor apparatus according to the present invention comprises;

a step of dividing a region in the semiconductor apparatus into a plurality of divided regions;

a step of forming test paths by arranging and wiring registers and logic gates from the respective top-stage divided regions to the bottom-stage divided regions vertically corresponding to each other in such manner as leading to a maximum inter-register delay time in the semiconductor apparatus; and a step of conducting a delay test for each test path.

According to the present invention, the delay test can be conducted without extracting the candidate paths in all of the divided regions. Further, because the input registers and output registers are logically directly connected to each other in a positive logic or a negative logic, it becomes very easy to create an initialization pattern, transition pattern, and expectation value pattern in a test pattern creation.

7) A method of testing a semiconductor apparatus according to the present invention comprises:

a step of dividing a region in the semiconductor apparatus into a plurality of divided regions;

a step of forming test paths by arranging and wiring registers and logic gates from the respective top-stage divided regions to the bottom-stage divided regions vertically corresponding to each other in such manner as leading to a maximum inter-register delay time in the semiconductor apparatus; and a step of simultaneously conducting a delay test for the test paths in all of the divided regions horizontally arranged.

According to the test method, the delay test is simultaneously conducted for the test paths in all of the divided regions horizontally arranged, therefore time required for the test can be reduced.

8) A method of testing a semiconductor apparatus according to the present invention comprises:

a step of dividing a region in the semiconductor apparatus into a plurality of divided regions;

a step of forming test paths by arranging and wiring registers and logic gates from the respective top-stage divided regions to the bottom-stage divided regions vertically corresponding to each other in such manner as leading to a maximum inter-register delay time in the semiconductor apparatus;

a step of setting test data in the registers in the respective top-stage divided regions from data-setting registers; and a step of simultaneously conducting a delay test for the test paths in all of the divided regions horizontally arranged.

According to the test method, because the test data is set in the register as a test object from the data-setting registers, it becomes unnecessary to additionally provide a test terminal.

9) A method of designing a semiconductor apparatus according to the present invention comprises:

a step of layouting logic circuits to be installed;

a step of dividing a region in the semiconductor apparatus after the layout is completed;

a step of forming test paths by arranging and wiring registers and logic gates from the respective top-stage divided regions to the bottom-stage divided regions vertically corresponding to each other in such manner as satisfying a design rule and leading to a maximum inter-register delay time in the semiconductor apparatus; and a step of conducting a delay test by measuring delay times in signal transmissions of the test paths.

According to the designing method, test circuits, such as a register for delay test, logic gate and wiring, can be additionally provided in such manner as eliminating any influence with respect to timings of the logic circuits.

10) A method of designing a semiconductor apparatus according to the present invention comprises:

a step of layouting logic circuits to be installed;

a step of dividing a region in the semiconductor apparatus while the layout is being carried out;

a step of forming test paths by arranging and wiring registers and logic gates from the respective top-stage divided regions to the bottom-stage divided regions vertically corresponding to each other in such manner as satisfying a design rule and leading to a maximum inter-register delay time in the semiconductor apparatus while the layout is being carried out; and a step of conducting a delay test by measuring delay times in signal transmissions of the test paths while the layout is being carried out.

10) is different to 9) in "while the layout is being carried out" instead of "after the layout is completed" in 10).

According to the designing method, the layout design is completed while the timing verification is being carried out, thereby resulting in reduced designing steps.

11) A semiconductor apparatus according to the present invention comprises:

a plurality of registers;

a plurality of paths, the plurality of paths connecting the respective registers and other registers; and a plurality of registers respectively disposed in a plurality of divided regions formed from horizontal and vertical divisions of an entire region in the semiconductor apparatus, the plurality of registers storing process information of each divided region 12) A semiconductor apparatus according to the present invention comprises:

a plurality of registers;

a plurality of paths, the plurality of paths connecting the respective registers and other registers;

a plurality of registers for delay test, the plurality of registers for delay test respectively disposed in, of a plurality of divided regions formed from horizontal and vertical divisions of an entire region of the semiconductor apparatus, the respective top-stage and the bottom-stage divided regions; and a plurality of test paths, the plurality of test paths connecting the vertically corresponding registers for delay test.

13) A semiconductor apparatus according to the present invention further comprises, in the configuration of 12), a plurality of selectors, the plurality of selectors selecting from scan data and transition data for respective inputs of the delay-test registers;

a plurality of setting terminals, the plurality of setting terminals setting the transition data in respective inputs of the selectors; and a selector control terminal, the selector control terminal applying a selector control signal to the respective selectors.

14) A semiconductor apparatus according to the present invention further comprises, in the configuration of 12), a plurality of selectors, the plurality of selectors selecting from scan data and transition data for respective inputs of the delay-test registers;

a plurality of setting registers, the plurality of setting registers setting the transition data in respective inputs of the selectors; and a selector control terminal, the selector control terminal applying a selector control signal to the respective selectors.

14) is different to 13) in that "registers" sot the transition data, instead of "terminals" in 13).

In the foregoing configuration, it is preferable for the selector control signal from the selector control terminal to be uniformly applied to all of the plurality of selectors.

The foregoing and other aspects of the invention will become apparent from the following description when considered in conjunction with the accompanying drawings.

BRIEF DESCRIPTION OF THE DRAWINGS

FIG. 7 shows a flow chart of designing a semiconductor apparatus according to an embodiment 9 of the present invention.

In all these figures, like components are indicated by the same numerals

DETAILED DESCRIPTION

Figure 1:
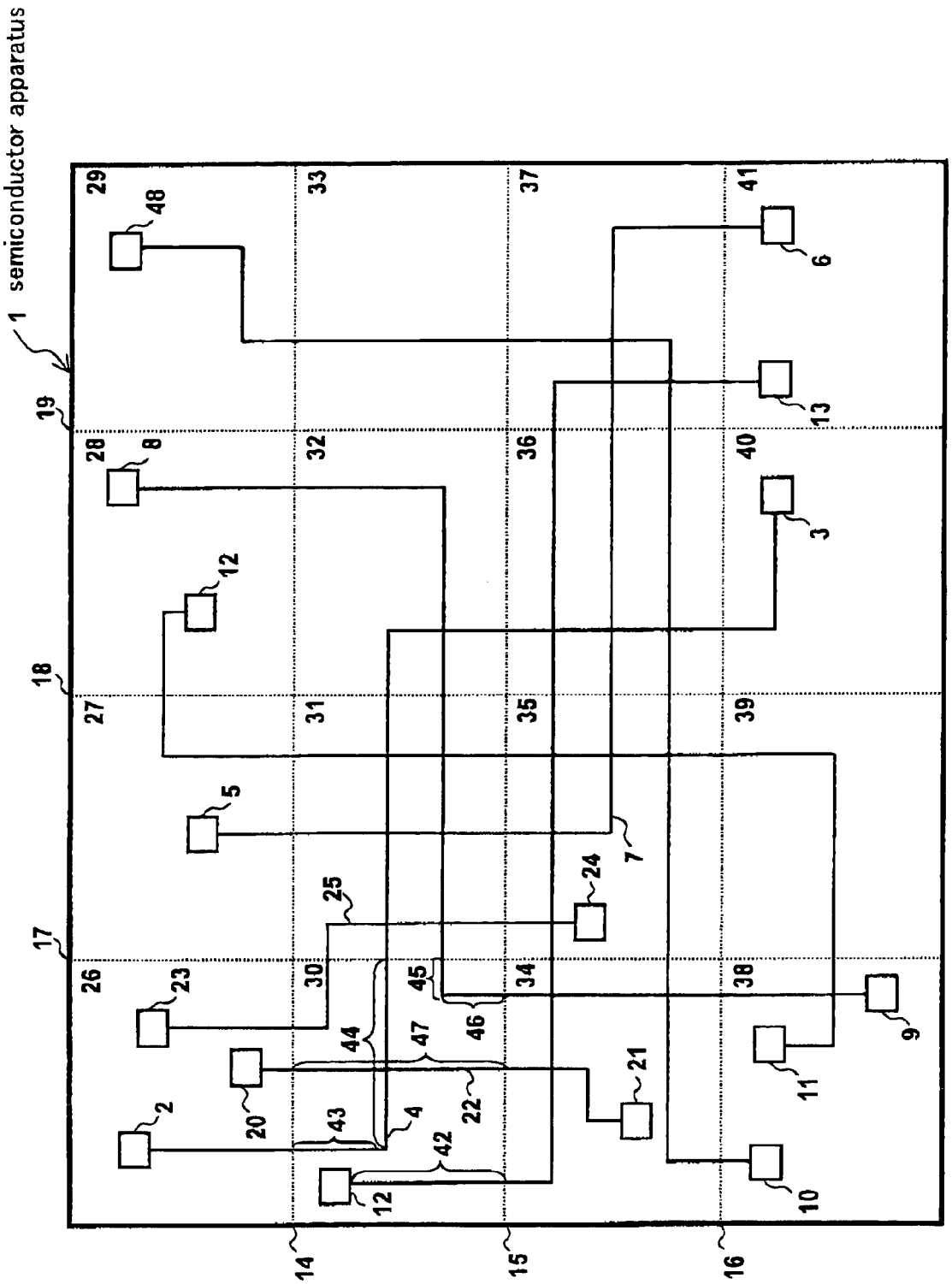
FIG. 1 shows a schematic illustration of a configuration of a semiconductor apparatus according to embodiments 1 and 2 of the present invention.

Hereinafter, preferred embodiments of a method of testing a semiconductor apparatus according to the present invention are described referring to the drawings.

EMBODIMENT 1

FIG. 1 shows a semiconductor apparatus according to an embodiment 1. A semiconductor apparatus 1 is divided by horizontal division lines 14, 15 and 16 and vertical division lines 17, 18 and 19 to thereby create divided regions 26-41. The divided region 26 includes registers 2, 20 and 23. The divided region 27 includes a register 5. The other divided regions also include registers.

Steps of the method of testing the semiconductor apparatus are as follows,

1) The semiconductor apparatus 1 is divided into a plurality of divided regions as described.
2) The registers present in the respective divided regions are extracted based on coordinates of the divided regions and registers.
3) All of paths routed from the extracted registers to other registers are extracted as candidate paths. The candidate paths are comprised of wirings and logic gates.
4) Concerning the plurality of extracted paths, delay times in signal transmissions are calculated based on arrangement wiring information, and the candidate path having a maximum delay time is selected as a critical path.

The registers and the candidate paths are extracted, and the delay times are calculated by means of a simulator.

5) A delay test is conducted for the critical path. More specifically, an initialization pattern is set in the critical path selected in each divided region by means of scan chain, and the critical path is operated. Next, a transition pattern is further set therein, and the critical path is operated. Finally, the test result is compared to an expectation value.

A specific example is described.

In the case of the register 2 in the divided region 26, a path routed by way of a path 4 to arrive at a register 3 is extracted as the candidate path. In the case of the register 20, a path routed by way of a path 22 to arrive at a register 21 is extracted as the candidate path. In the case of the register 23, a path routed by way of a path 25 to arrive at a register 24 is extracted as the candidate path.

Next, the delay times of the plurality of candidate paths are compared to each other to thereby select the candidate path having a maximum delay time as the critical path. In the present example, the candidate path routed by way of the path 4 to arrive at the register 3 is selected as the critical path.

Thereafter, the candidate paths are extracted in the respective divided regions to thereby select the critical path in the same manner.

Next, the delay test is conducted. More specifically, the scan chain in the semiconductor apparatus 1 is used to thereby set the initialization pattern in the register 2 of the critical path in the divided region 26, and the register 2 is operated. Next, the transition pattern is further set therein, and the register 2 is operated. Finally, the test result is compared to the expectation value.

Thereafter, the delay test is conducted for the critical paths in the divide regions 27-41 in the same manner.

As described, the delay test can be conducted for the critical path, and the semiconductor apparatus can be accurately screened even in the case where a critical path in a designing process and a critical path of an actual chip are different due to process variation.

EMBODIMENT 2

An embodiment 2 is further described referring to FIG. 1.

Referring to the divided region 30, wiring paths 42, 43, 44, 45, 46 and 47 are extracted.

Steps of the method of testing the semiconductor apparatus are as follows.

1) The semiconductor apparatus 1 is divided into a plurality of divided regions as described.
2) All of wiring paths in the divided regions are extracted.
3) Paths routed from registers to the registers by way of the respective extracted wiring paths are selected as candidate paths.
4) Delay times in the plurality of candidate paths are compared to each other to thereby select the candidate path having a maximum delay time is selected as a critical path.
5) A delay test is conducted for the critical path. More specifically, the initialization pattern is set in the critical paths selected in the respective divided regions, and the critical path is operated. Next, the transition pattern is set therein, and the critical path is operated. Finally, the test result is compared to the expectation value.

A specific example is described.

In the divided region 30, a candidate path starting at a register 12 and arriving at a register 13 is obtained for the wiring path 42. A candidate path starting at the register 2 and arriving at the register 3 is obtained for the wiring paths 43 and 44. A candidate path starting at a register 8 and arriving at a register 9 is obtained for the wiring paths 45 and 46. A candidate path starting at the register 20 and arriving at the register 21 is obtained for the wiring path 47.

Next, delay times of the plurality of candidate paths are compared to each other to thereby select the candidate path having a maximum delay time as a critical path. In the present example, the path from the register 2 through the register 3 including the wiring paths 43 and 44 is selected in the divided region 30.

Thereafter, the candidate paths are extracted in the respective divided regions to thereby select the critical paths therein in the same manner.

Then, a delay test is conducted for the respective divided regions as in the embodiment 1.

As described, as far as the wirings and logic gates are present in the divided region having no register, the critical path can be obtained and delay-tested. Therefore, even in the case where the critical path of the actual chip is different to the critical path in the designing process due to the process variation, the semiconductor apparatus can be accurately screened through the delay test for the critical path.

EMBODIMENT 3

Figure 2:
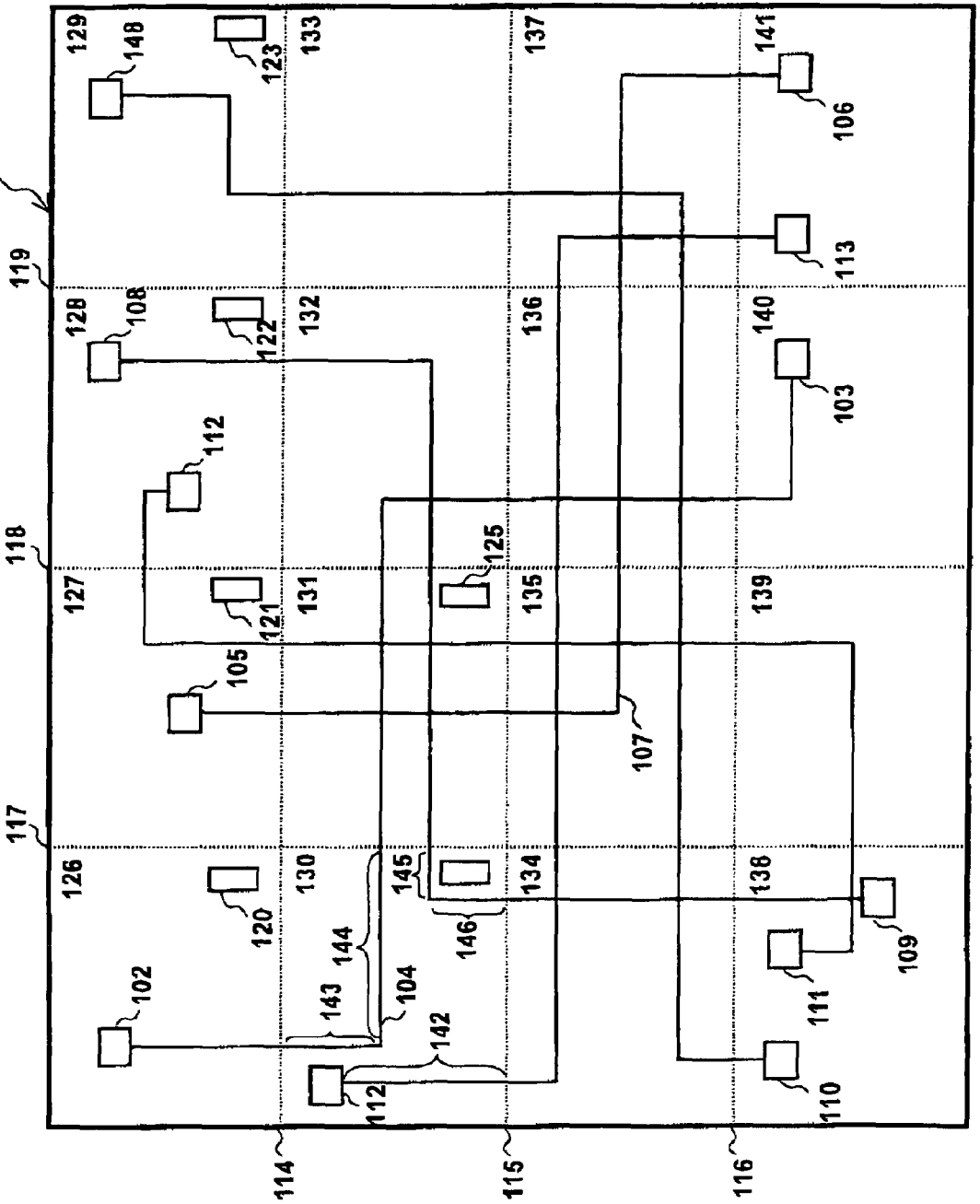
FIG. 2 shows a schematic illustration of a configuration of a semiconductor apparatus according to embodiments 3 and 4 of the present invention.

FIG. 2 shows a semiconductor apparatus according to an embodiment 3. A semiconductor apparatus 101 is divided by horizontal division lines 114, 115 and 116 and vertical division lines 117, 118 and 119 to thereby create divided regions 126-141. Each divided region includes a register, the register storing process information of the relevant divided region. The divided region 126 includes a register 120 storing the process information. The divided region 127 includes a register 121 storing the process information. The process-information registers are present in other divided regions as well.

Steps of the method of testing the semiconductor apparatus are as follows.

1) The semiconductor apparatus 101 is divided into a plurality of divided regions as described.
2) Registers present in the respective divided regions are extracted based on coordinates of the divided regions and registers.
3) All of paths extending from the extracted registers to other registers are extracted as candidate paths.
4) Delay times in signal transmissions of the extracted plurality of candidate paths are calculated to thereby select the candidate path having a maximum delay time as a critical path.
5) The process information of each respective divided region is specified to thereby select the divided region having a maximum delay time based on the process information (selected region).
6) A delay test is conducted for the critical path in the selected region.

As described, the selected region having the maximum delay time is selected based on the process information of each respective divided region. The delay test is conducted for the critical path in designing process and the critical path in the selected region. The testis conducted in the same manner as in the embodiment 1.

According to the test method, the divided region having the maximum delay time is previously selected using the process information in spite of the process variation generated in the semiconductor apparatus. Therefore, the semiconductor apparatus can be screened without conducting the test for all of the divided regions.

EMBODIMENT 4

An embodiment 4 is described referring to FIG. 2.

In the divided region 130, wiring paths 142, 143, 144, 145 and 146 are extracted. Next, candidate paths including the respective wiring paths are extracted. The candidate path including the path 142 is a path starting at a register 112 and arriving at a register 113. The candidate path including the paths 143 and 144 is a path starting at a register 102 and arriving at a register 103. The candidate path including the paths 145 and 146 is a path starting at a register 108 and arriving at a register 109.

Each divided region includes a register storing process information of the relevant divided region. The divided region 126 includes the register 120 storing the process information. The divided region 127 includes the register 121 storing the process information. The other divided regions also include process-information registers.

Steps of the method of testing the semi conductor apparatus are as follows.

1) All of the wiring paths in the respective divided regions are extracted.
2) The delay times of the candidate paths routed by way of the respective wiring paths are compared to each other to thereby select the critical path. In the present example, the path from the register 102 through the register 103, which is the candidate path including the paths 143 and 144, is selected.
3) Thereafter, the candidate paths in the respective divided regions are extracted
4) When the test is conducted for the semiconductor apparatus, the divided region having a maximum delay time is judged from the process information of each respective divided region.
5) In addition to the test conducted for the critical path at the time of designing, the critical path of the divided region having the maximum time delay is tested. The test is conducted in the same manner as described in the embodiment 1.

As described, as far as the wirings and logic gates are present in the divided region having no register, the signal transmission paths can be extracted. Further, the divided region having the maximum delay time is previously selected using the process information in spite of the process variation generated in the semiconductor apparatus. Therefore, the semiconductor apparatus can be screened without conducting the test for all of the divided regions.

EMBODIMENT 5

An embodiment 5 relates to awareness of the presence of registers in the divided regions. When the register is present across more than one divided region, it becomes difficult to discriminate which divided region the register belongs to. To put it differently, it becomes difficult to divide the register among the plurality of divided regions.

Figure 3:
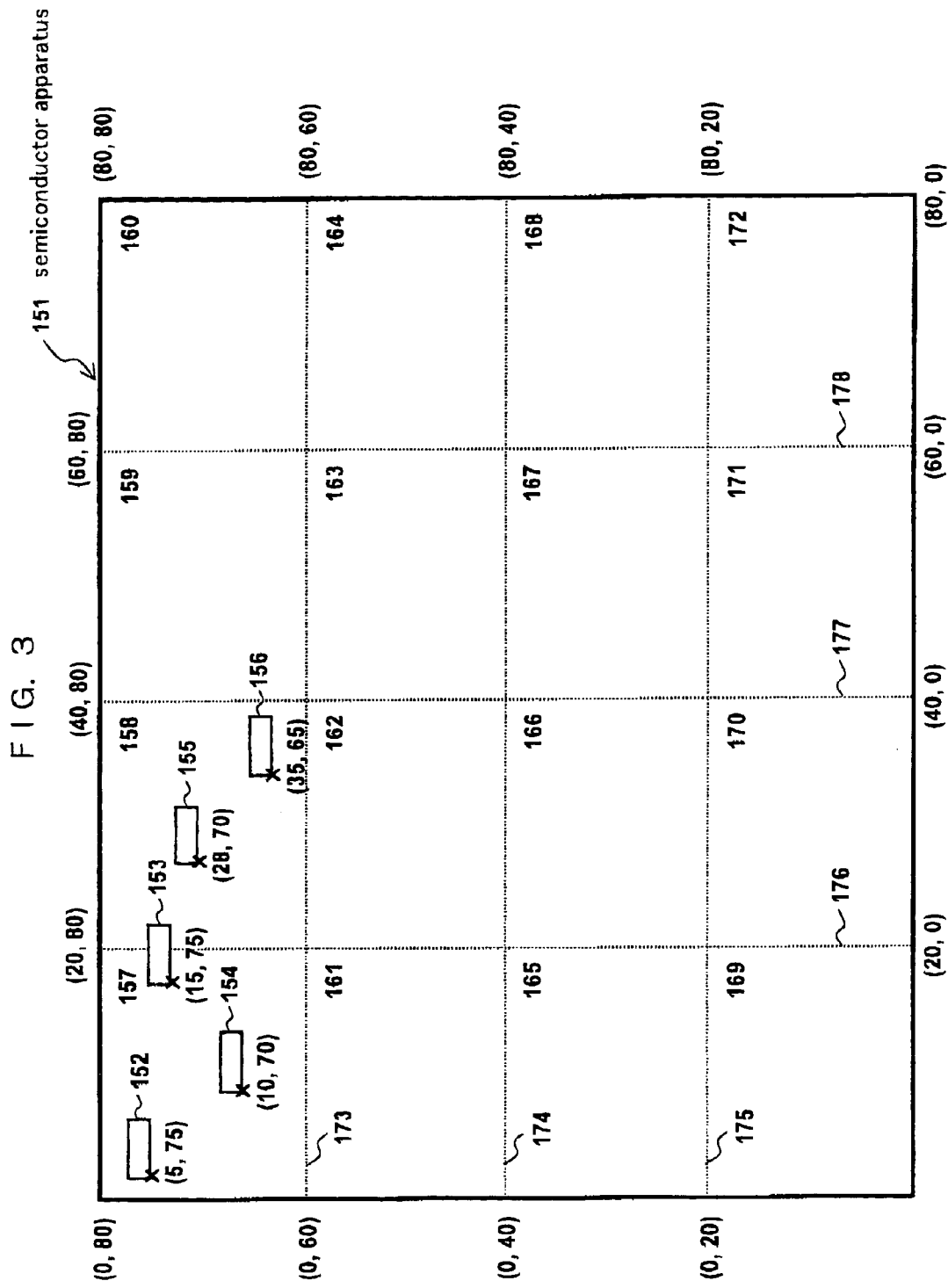
FIG. 3 shows a schematic illustration of a configuration of a semiconductor apparatus according to an embodiment 5 of the present invention.

In FIG. 3, a semiconductor apparatus 151 is divided by horizontal division lines 173, 174 and 175 and vertical division lines 176, 177 and 178 to thereby create divided regions 157-172. Registers 152 and 154, and a part of a register 153 are present in the divided region 157. Registers 155 and 156, and a part of the register 153 are present in the divided region 158. Any register included in the other divided regions is not shown in the drawing.

Steps of the method of testing the semiconductor apparatus are as follows.

The registers present in the respective divided regions are extracted based on coordinates of the divided regions and left lower coordinates of the registers. In the divided region 157, the registers at zero or more and less than 20 in X coordinate and 60 or more and less than 90 in Y coordinate are extracted. In the present embodiment, the registers 152, 153 and 154 are extracted. In the divided region 158, the registers 155 and 156 are extracted. In the same manner, the registers are extracted in the respective divided regions.

Thereafter, in the same manner as in the embodiment 1, paths extending from the registers to registers are extracted, delay times are calculated, critical paths are selected, and the test pattern is created to thereby screen the semiconductor apparatus.

As described, the positions of the registers are judged from the arrangement coordinate data. Therefore, the registers present across the divided regions can be easily determined in which divided region they belong to.

EMBODIMENT 6

Figure 4:
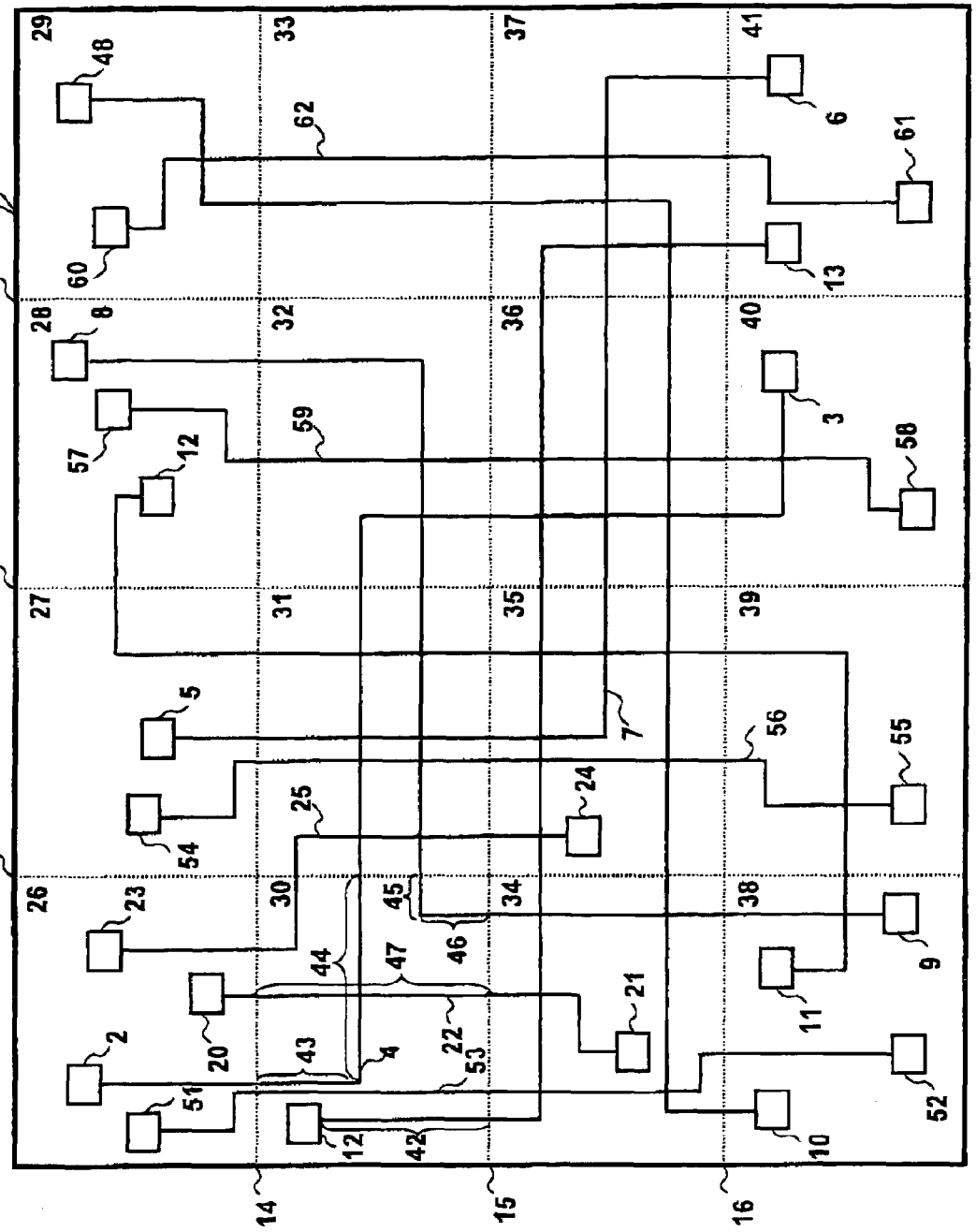
FIG. 4 shows a schematic illustration of a configuration of a semiconductor apparatus according to an embodiment 6 of the present invention.

In FIG. 4, a semiconductor apparatus 1 is divided by the horizontal division lines 14, 15 and 16 and vertical division lines 17, 18 and 19 into the divided regions 26-41 in the same manner as shown in FIG. 1.

In addition to registers constituting logic circuits, a register for delay test is disposed in each top-stage divided region and bottom-stage divided region. The registers vertically corresponding to each other are connected by means of a logic gate and wiring.

In the top-stage divided region 26, the registers 2, 20, 23 and 51 are present. The registers 2, 20 and 23 constitute the logic circuits realized in the semiconductor apparatus. In contrast to that, a register 51 is installed for the purpose of the delay test. In the bottom-stage divided region 38, registers 9, 10, 11 and 52 are present. The registers 9, 10 and 11 constitute the logic circuits realized in the semiconductor apparatus. In contrast to that, the register 52 is installed for the purpose of the delay test. An output of the register 51 is connected to a test path 53 comprised of the wiring and logic gate. The test path 53 is inputted to the register 52. Concerning the registers 51 and 52 and the test path 53, the registers and logic gates are arranged and wired in such manner as being equal to a maximum inter-register delay time in the semiconductor apparatus 1.

In the same manner, a delay-test register 54 in the top-stage divided region 27 and a delay-test register 55 in the bottom-stage divided region 39 are connected to each other via a test path 56.

Further, a delay-test register 57 in the top-stage divided region 28 and a delay-test register 58 in the bottom-stage divided region 40 are connected to each other via a test path 59.

Further, a delay-test register 60 in the top-stage divided region 29 and a delay-test register 61 in the bottom-stage divided region 41 are connected to each other via a test path 62.

Concerning the test paths 56, 59 and 62, the registers and logic gates are arranged and wired in such manner as being equal to the maximum inter-register delay time in the semiconductor apparatus 1.

The wirings are configured in such manner that an input to the bottom-stage registers is changed in accordance with a variation of an output signal of the top-stage registers. The logic gates can employ any type of circuit available. When a multiple-input logic gate is employed, terminals thereof, except for a terminal inputting therein a signal transmitted from the top-stage register, are fixed to such a level as not affecting the operation of the logic gate.

As described, the initialization pattern and transition pattern are set and the output registers are confirmed with respect to the registers thus arranged and wired, which are installed for the delay test, in the same manner as in the embodiment 1 to thereby conduct the delay test.

As described, the delay test is conducted limited to the paths extending from the top-stage divided regions to the bottom-stage divided regions. Therefore, it becomes unnecessary to extract the candidate paths for the inter-register delays in all of the divided regions to conduct the delay test. Further, the initialization pattern, transition pattern, and expectation value pattern can be very easily created because the input registers and output registers are logically directly connected to each other in a positive logic or negative logic.

EMBODIMENT 7

Figure 5:
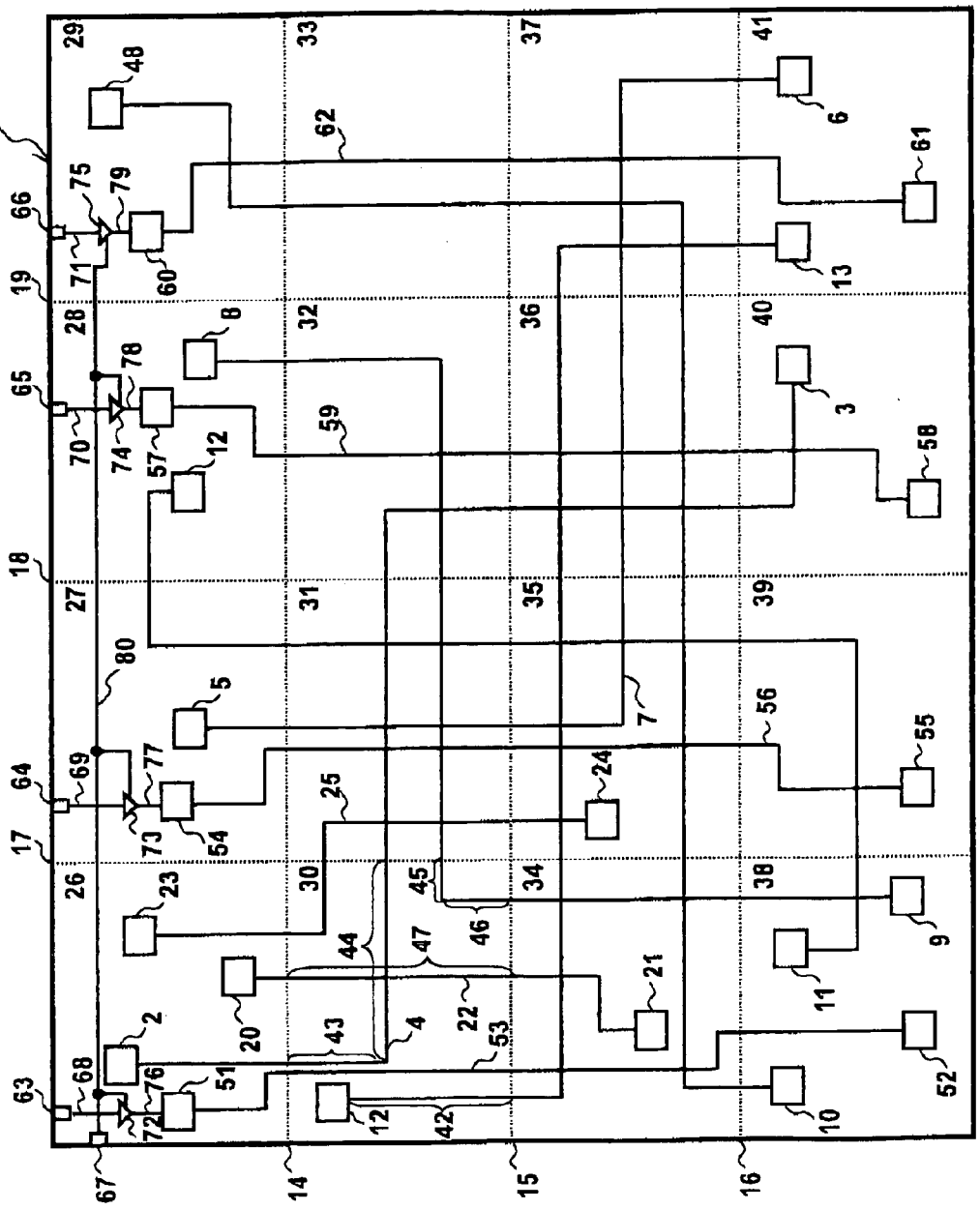
FIG. 5 shows a schematic illustration of a configuration of a semiconductor apparatus according to an embodiment 7 of the present invention.

An embodiment 7 is described referring to FIG. 5.

In the same manner as in the embodiment 6, registers are disposed in respective top-stage and corresponding bottom-stage divided regions, and the corresponding registers are connected to each other.

Terminals 63-66 for setting the transition data are disposed. Selectors 72-75 for selecting from ordinary scan data input and data input from the transition-data-setting terminals are provided for top-stage registers for delay test. To the respective selectors is inputted a selector control signal 80 from a selector control terminal 67 of the scan data input. The setting terminals 63-66 and the selector control terminal 67 are not required in normal operation, therefore can be used for other purpose.

An output 68 of the transition-data-setting terminal 63 is inputted to the selector 72. Though not shown in the drawing, another input of the selector 72 constitutes an ordinary scan data input signal with respect to the register 51, which configuration is applied to respective relationships between the other setting terminals 64, 65 and 66 and the selectors 73, 74 and 75.

When the semiconductor apparatus is tested, the initialization pattern is set in an ordinary scan pattern with respect to the top-stage registers. Then, the selector control signal 80 is changed to a level that the transition data is selected from the setting terminals, and the transition data is, at the same time, set in the respective top-stage registers. At a next clock, values of the bottom-stage registers are compared to each other.

As described, the delay test is conducted limited to the paths extending from the registers in the top-stage divided regions to the registers in the bottom-stage divided regions. Therefore, the delay test can be conducted without extracting the candidate paths for inter-register delays in all of the divided regions. Further, the delay test is simultaneously conducted for all of the horizontally arranged divided regions so that time required for the test can be reduced. Further, a test pattern can be easily created.

EMBODIMENT 8

Figure 6:
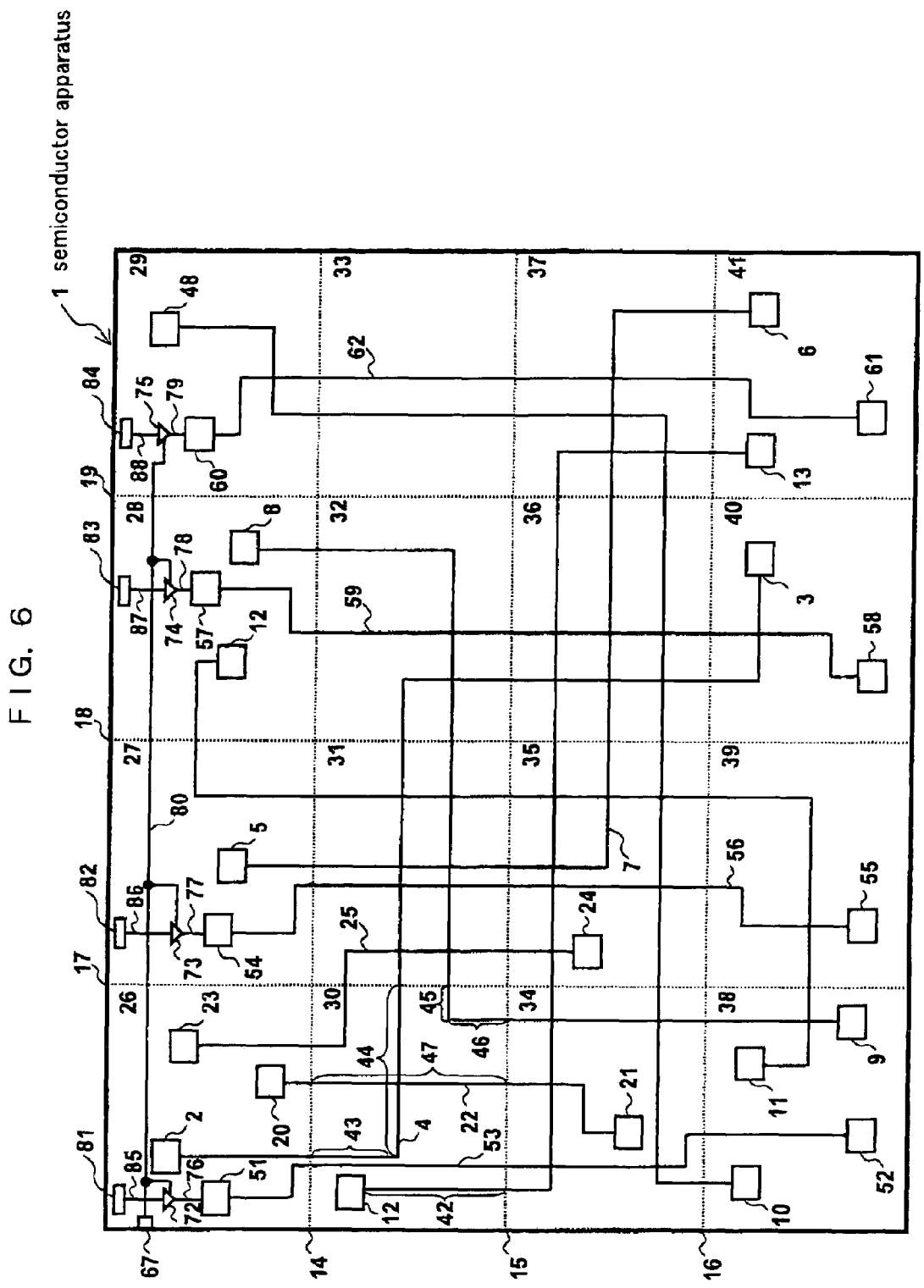
FIG. 6 shows a schematic illustration of a configuration of a semiconductor apparatus according to an embodiment 8 of the present invention.

An embodiment 8 is described referring to FIG. 6.

In the same manner as in the embodiment 7, the registers are disposed in the respective top-stage and corresponding bottom-stage divided regions, and the corresponding registers are connected to each other Registers 81-84 for setting the transition data are disposed. Selectors 72-75 for selecting from the ordinary scan data input and data input from the transition-data-setting registers are provided for the top-stage registers for delay test. To the respective selectors is inputted the selector control signal 80 from the selector control terminal 67 of the scan data input.

An output 85 of the transition-data-setting register 81 is inputted to the selector 72. Though not shown in the drawing, another input of the selector 72 constitutes an ordinary scan data input signal with respect to a register 51, which configuration is applied to respective relationships between the other setting registers 82, 83 and 84 and the selectors 73, 74 and 75.

When the semiconductor apparatus is tested, the initialization pattern is set in the ordinary scan pattern with respect to the top-stage registers, and the transition pattern is set in the setting registers 81-84. Then, the selector control signal 80 is changed to a level that the transition data is selected from the setting registers, and the transition data is, at the same time, set in the top-stage respective registers. At a next clock, values of the respective bottom-stage registers are compared to each other.

As described, the delay test is simultaneously conducted for the respective divided regions without further providing a test terminal for setting the transition data for delay test. Therefore, time required for the test can be reduced.

EMBODIMENT 9

FIG. 7 shows a flow chart of a design method when a semiconductor apparatus according to an embodiment 9 is tested. Respective blocks therein denote design phases.

In a phase 200, a logic design of the semiconductor apparatus is carried out. Next, in a phase 201, logic circuits are layoutted. Then, in a phase 202, timing verification is carried out with respect to the logic circuits. When the timing verification results in NG, the process from the phase 201 or the phase 200 onward is carried out again.

When the timing verification shows the result of OK, test circuits are layoutted in a phase 203. Next, the timing verification is carried out with respect to the test circuits in a phase 204. When the timing verification results in NG, the process is carried out again from the phase 203 onward. When the timing verification results in OK, proceeds to a phase 205, in which the design is completed.

In the phase 203, the test circuits are layoutted in such manner as not affecting the timings of the logic circuits. More specifically, the test circuits are layoutted so that current delay volume of the critical paths is not increased in response to the wirings of the registers and logic gates. The test circuits are further layoutted in such manner that any path affected by the wirings of the registers and logic gates is not selected as the critical path.

As shown in FIG. 4, the semiconductor apparatus is divided at fixed intervals. The registers and the logic gates are arranged and wired from the top-stage divided regions to the corresponding bottom-stage divided regions in such manner as being equal to a maximum inter-register delay time. The registers are disposed in the top-stage and bottom-stage divided regions, and the logic gates are disposed and wired in the intermediate divided regions between the top-stage and bottom-stage divided regions. Thereafter, the delay test is conducted for the semiconductor apparatus in the same manner as described in the embodiment 6.

As described, it is possible to add the delay-test register, logic gate, and wiring in such manner as eliminating any influence with respect to the timings of the logic circuits

EMBODIMENT 10

Figure 8:
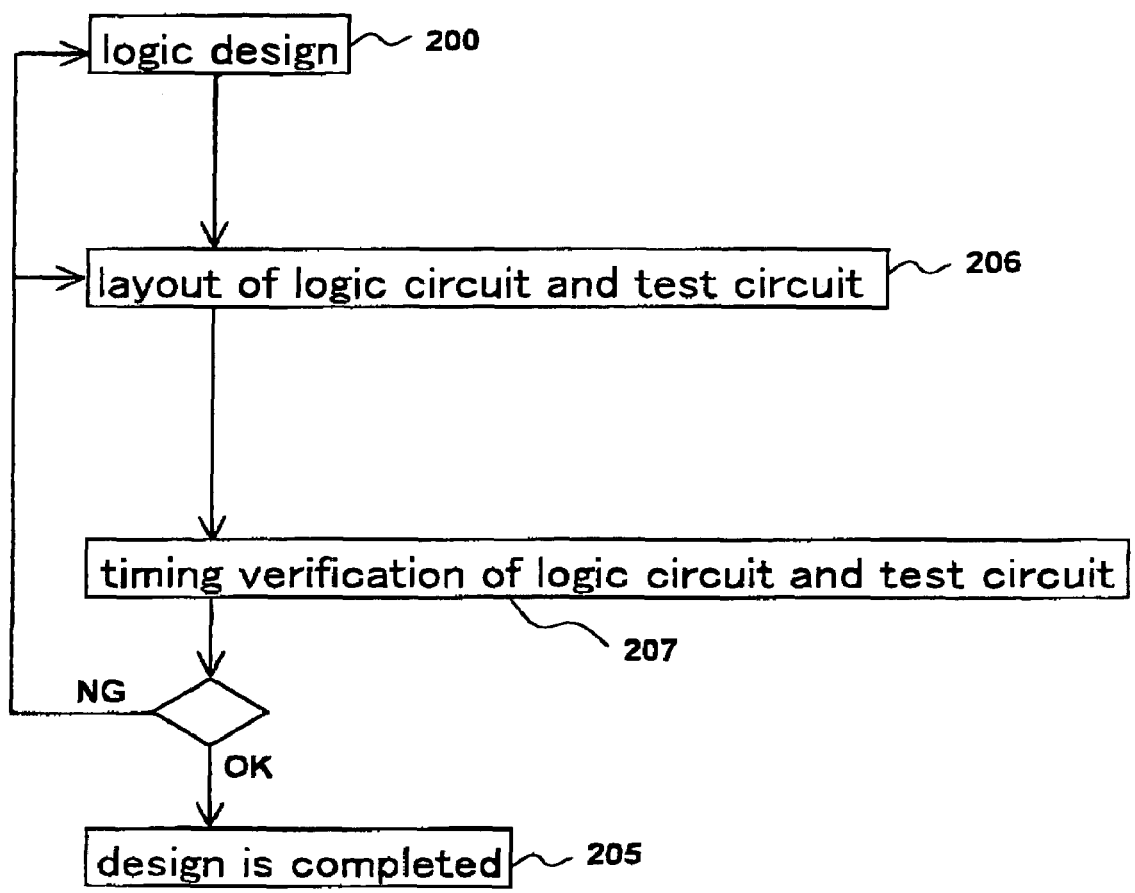
FIG. 8 shows a flow chart of designing a semiconductor apparatus according to an embodiment 10 of the present invention.

FIG. 8 shows a flow chart of a design method when a semiconductor apparatus according to an embodiment 10 is tested. Respective blocks therein denote design phases.

In a phase 200, the logic design of the semiconductor apparatus is carried out. Next, in a phase 206, logic circuits and test circuits are layoutted. Then, in a phase 207, the timing verification is carried out with respect to the logic circuits and the test circuits. When the timing verification results in NG, the process from the phase 200 or the phase 206 onward is carried out again. When the timing verification results in OK, proceeds to a phase 205, in which the design is completed.

In the phase 206, the test circuits are layoutted in such manner as not affecting the timings of the logic circuits. More specifically, the test circuits are layoutted so that the current delay volume of the critical paths is not increased in response to the wirings of the registers and logic gates. The test circuits are further layoutted in such manner that any path affected by the wirings of the registers and logic gates is not selected as the critical path.

As shown in FIG. 4, the semiconductor apparatus is divided at the fixed intervals. The registers and the logic gates are arranged and wired from the top-stage divided regions to the corresponding bottom-stage divided regions in such manner as being equal to a maximum inter-register delay time. The registers are disposed in the top-stage and bottom-stage divided regions, and the logic gates are disposed and wired in the intermediate divided regions between the top-stage and bottom-stage divided regions. Thereafter, the delay test is conducted for the semiconductor apparatus in the same manner as described in the embodiment 6.

As described, the layout design is completed while the timing verification is being carried to thereby add the delay-test register, logic gate, and wiring in such manner as eliminating any influence with respect to the timings of the logic circuits in reduced designing steps.

As described, according to the present invention, the semiconductor apparatus can be accurately screened even in the case where the critical path in the designing process and the critical path of the actual chip are different due to the process variation.

From the above description, it will be apparent what the present invention provides.

What is claimed is:

1. A method of testing a semiconductor apparatus comprising:
    a step of dividing a layout region in the semiconductor apparatus into a plurality of divided latticed layout regions;
    a step of extracting all of paths starting at registers and terminating at other registers present in the respective divided regions as candidate paths;
    a step of calculating delay times in signal transmissions of the candidate paths and selecting the candidate path having a maximum delay time in each divided latticed layout region as a critical path; and
    a step of conducting a delay test for the critical path in each divided latticed layout region.

2. The method of claim 1, wherein each of the plurality of latticed layout regions share one or more sets of coordinates with at least one other adjacent latticed layout region.

3. A method of testing a semiconductor apparatus comprising:
    a step of dividing a layout region in the semiconductor apparatus into a plurality of divided latticed layout regions;
    a step of extracting all of wirings present in the respective divided latticed layout regions;
    a step of extracting paths connecting registers by way of the extracted wirings as candidate paths;
    a step of calculating delay times in signal transmissions of the candidate paths and selecting the candidate path having a maximum delay time in each divided latticed layout region as a critical path; and
    a step of conducting a delay test for the critical path in each divided latticed layout region.

4. A method of testing a semiconductor apparatus comprising:
    a step of dividing a layout region in the semiconductor apparatus into a plurality of divided latticed layout regions;
    a step of extracting all of paths starting at registers and terminating at other registers present in the respective divided latticed layout regions as candidate paths;
    a step of calculating delay times in signal transmissions of the candidate paths and selecting the candidate path having a maximum delay time in each divided latticed layout region as a critical path;
    a step of selecting the divided region having a maximum delay time in the signal transmission based on process information of each divided region; and
    a step of conducting a delay test for the critical path in each divided latticed layout region.

5. A method of testing a semiconductor apparatus comprising:
    a step of dividing a layout region in the semiconductor apparatus into a plurality of divided latticed layout regions;
    a step of extracting all of wirings present in the respective divided latticed layout regions;
    a step of extracting paths connecting registers by way of the extracted wirings as candidate paths;
    a step of calculating delay times in signal transmissions of the candidate paths and selecting the candidate path having a maximum delay time in each divided latticed layout region as a critical path;
    a step of selecting the divided region having a maximum delay time in the signal transmission based on process information of each divided latticed layout region; and
    a step of conducting a delay test for the critical path in each divided latticed layout region.

6. A method of testing a semiconductor apparatus comprising:
    a step of dividing a layout region in the semiconductor apparatus into a plurality of divided latticed layout regions;
    a step of judging registers present in the respective divided latticed layout regions from arrangement coordinate information of each divided region and extracting all of paths starting at the registers and terminating at other registers as candidate paths;
    a step of calculating delay times in signal transmissions of the candidate paths and selecting the candidate path having a maximum delay time in each divided latticed layout region as a critical path; and
    a step of conducting a delay test for the critical path in each divided latticed layout region.

7. A method of testing a semiconductor apparatus comprising:
    a step of dividing a layout region in the semiconductor apparatus into a plurality of divided latticed layout regions;
    a step of forming test paths by arranging and wiring registers and logic gates from the top-stage divided latticed layout regions to the vertically corresponding bottom-stage divided latticed layout regions to achieve a maximum inter-register delay time in the semiconductor apparatus; and
    a step of conducting a delay test for the critical path in each divided latticed layout region.

8. A method of testing a semiconductor apparatus comprising:
    a step of dividing a layout region in the semiconductor apparatus into a plurality of divided latticed layout regions;
    a step of forming test paths by arranging and wiring registers and logic gates from the top-stage divided latticed layout regions to the vertically corresponding bottom-stage divided latticed layout regions to achieve a maximum inter-register delay time in the semiconductor apparatus; and
    a step of simultaneously conducting a delay test for the test paths in all of the divided latticed layout regions horizontally arranged.

9. A method of testing a semiconductor apparatus comprising:
    a step of dividing a layout region in the semiconductor apparatus into a plurality of divided latticed layout regions;
    a step of forming test paths by arranging and wiring registers and logic gates from the top-stage divided latticed layout regions to the vertically corresponding bottom-stage divided latticed layout regions to achieve a maximum inter-register delay time in the semiconductor apparatus;

a step of setting test data in the registers of the top-stage divided latticed layout regions from registers for setting data; and a step of simultaneously conducting a delay test for the test paths in all of the divided latticed layout regions horizontally arranged.

10. A method of designing a semiconductor apparatus comprising:

a step of laying out logic circuits to be installed;

a step of dividing a layout region in the semiconductor apparatus after the layout is completed;

a step of forming test paths by arranging and wiring registers and logic gates from top-stage divided latticed layout regions to vertically corresponding bottom-stage divided latticed layout regions to achieve a design rule and leading to a maximum inter-region delay time in the semiconductor apparatus; and a step of conducting a delay test by measuring delay times in signal transmissions of the test paths.

11. A method of designing a semiconductor apparatus comprising:

a step of laying out logic circuits to be installed;

a step of dividing a layout region in the semiconductor apparatus while the layout is being carried out;

a step of forming test paths by arranging and wiring registers and logic gates from top-stage divided regions to vertically corresponding bottom-stage divided regions to achieve a design rule and leading to a maximum inter-region delay time in the semiconductor apparatus while the layout is being carried out; and a step of conducting a delay test by measuring delay times in signal transmissions of the test paths while the layout is being carried out.

\* \* \* \* \*